(12) United States Patent
Parker

(10) Patent No.: US 12,176,677 B2
(45) Date of Patent: Dec. 24, 2024

(54) ELECTRO-ABSORPTION MODULATOR WITH IMPROVED PHOTOCURRENT UNIFORMITY

(71) Applicant: OpenLight Photonics, Inc., Goleta, CA (US)

(72) Inventor: John Parker, Goleta, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 871 days.

(21) Appl. No.: 16/728,999

(22) Filed: Dec. 27, 2019

(65) Prior Publication Data

US 2021/0203126 A1    Jul. 1, 2021

(51) Int. Cl.
*G02F 1/01*     (2006.01)
*G02F 1/025*    (2006.01)
*H01S 5/026*    (2006.01)
*G02F 1/015*    (2006.01)

(52) U.S. Cl.
CPC .......... *H01S 5/0265* (2013.01); *G02F 1/0123* (2013.01); *G02F 1/0147* (2013.01); *G02F 1/025* (2013.01); *G02F 1/0157* (2021.01)

(58) Field of Classification Search
None
See application file for complete search history.

(56) References Cited

U.S. PATENT DOCUMENTS

| | | | |
|---|---|---|---|
| 7,050,689 B2 | 5/2006 | Wipiejewski et al. | |
| 10,809,548 B2 | 10/2020 | Roth et al. | |
| 11,409,141 B2 | 8/2022 | Roth et al. | |
| 11,698,544 B2 | 7/2023 | Roth et al. | |
| 2004/0028099 A1 | 2/2004 | Hongo et al. | |
| 2004/0090659 A1 | 5/2004 | Zhang et al. | |
| 2004/0109658 A1 | 6/2004 | Wipiejewski et al. | |
| 2012/0269215 A1 | 10/2012 | Lv | |

(Continued)

FOREIGN PATENT DOCUMENTS

| | | |
|---|---|---|
| CN | 110291451 | 9/2019 |
| CN | 113050304 | 6/2021 |

(Continued)

OTHER PUBLICATIONS

"European Application Serial No. 20165828.3, Extended European Search Report mailed Sep. 9, 2020", 7 pgs.

(Continued)

*Primary Examiner* — Christopher Stanford
*Assistant Examiner* — Journey F Sumlar
(74) *Attorney, Agent, or Firm* — Schwegman Lundberg & Woessner, P.A.

(57) ABSTRACT

Disclosed are integrated electro-absorption modulators (EAM) that are structured and/or operated to improve uniformity of the photocurrent density along the active region. In various embodiments, this improvement results from increased optical absorption at the rear of the EAM, e.g., as achieved by heating a region at the rear, increasing a bias voltage applied across the EAM towards the rear, or changing a material composition of an intrinsic layer towards the rear. In another embodiment, the improvement is achieved by coupling light from a waveguide into the EAM active region continuously along a length of the EAM, using overlap between a tapered section of the waveguide and the EAM.

14 Claims, 13 Drawing Sheets

(56) References Cited

U.S. PATENT DOCUMENTS

| | | |
|---|---|---|
| 2014/0254978 A1 | 9/2014 | Koch et al. |
| 2016/0377953 A1 | 12/2016 | Feng et al. |
| 2017/0351124 A1 | 12/2017 | Roth et al. |
| 2018/0149890 A1 | 5/2018 | Cai et al. |
| 2021/0018769 A1 | 1/2021 | Roth et al. |
| 2022/0350180 A1 | 11/2022 | Roth et al. |

FOREIGN PATENT DOCUMENTS

| | | | |
|---|---|---|---|
| EP | 0871057 A2 * | 10/1998 | ......... G02F 1/01708 |
| JP | H05291695 | 11/1993 | |
| KR | 20170071985 | 6/2017 | |
| KR | 20180028331 | 3/2018 | |
| KR | 20190071827 | 6/2019 | |
| TW | 200703830 A | 1/2007 | |
| TW | 201331990 A | 8/2013 | |
| TW | 202125844 A | 7/2021 | |
| WO | WO-2018007824 A1 | 1/2018 | |
| WO | 2018132158 | 7/2018 | |

OTHER PUBLICATIONS

"Korean Application Serial No. 10-2020-0035503, Response filed Jun. 28, 2021 to Notice of Preliminary Rejection mailed Apr. 26, 2021", With English claims, 39 pages.

"Taiwanese Application Serial No. 109106895, Decision of Rejection mailed Oct. 28, 2021", With English machine translation, 11 pgs.

"Taiwanese Application Serial No. 201780070552.1, First Office Action mailed Jul. 22, 2021", With English translation, 14 pages.

"Korean Application Serial No. 10-2020-0035503, Notice of Preliminary Rejection mailed Apr. 26, 2021", With English translation, 15 pages.

"U.S. Appl. No. 15/685,374, Notice of Allowance malled Jun. 17, 2020", 10 pgs.

"U.S. Appl. No. 15/685,374, Response filed Apr. 6, 2020 to Restriction Requirement mailed Feb. 6, 2020", 8 pgs.

"U.S. Appl. No. 15/685,374, Restriction Requirement mailed Feb. 6, 2020", 7 pgs.

"U.S. Appl. No. 17/032,637, Non Final Office Action mailed Dec. 9, 2021", 7 pgs.

"U.S. Appl. No. 17/032,637, Notice of Allowance mailed Apr. 4, 2022", 8 pgs.

"U.S. Appl. No. 17/032,637, Response filed Mar. 9, 2022 to Non Final Office Action mailed Dec. 9, 2021", 9 pgs.

"U.S. Appl. No. 17/032,637, Response filed Nov. 19, 2021 to Restriction Requirement mailed Sep. 30, 2021", 5 pgs.

"U.S. Appl. No. 17/032,637, Restriction Requirement mailed Sep. 30, 2021", 6 pgs.

"U.S. Appl. No. 17/864,591, Corrected Notice of Allowability mailed Mar. 9, 2023", 2 pgs.

"U.S. Appl. No. 17/864,591, Notice of Allowance mailed Mar. 3, 2023", 9 pgs.

"U.S. Appl. No. 17/864,591, Response filed Jan. 10, 2023 to Restriction Requirement mauled Nov. 10, 2022", 6 pgs.

"U.S. Appl. No. 17/864,591, Restriction Requirement mailed Nov. 10, 2022", 6 pgs.

"European Application Serial No. 20165828.3, Communication Pursuant to Article 94(3) EPC mailed Jan. 17, 2023", 4 pgs.

"European Application Serial No. 20165828.3, Response filed May 16, 2023 to Communication Pursuant to Article 94(3) EPC mailed Jan. 17, 2023", 6 pgs.

"Taiwanese Application Serial No. 109106895, Office Action mailed Jan. 10, 2023", With English machine translation, 13 pgs.

"Taiwanese Application Serial No. 109106895, Response filed Apr. 7, 2023 to Office Action mailed Jan. 10, 2023", w/ English claims, 11 pgs.

"Chinese Application Serial No. 202010225273.1, Office Action mailed Sep. 19, 2023", With English machine translation, 13 pages.

* cited by examiner

Section B-B

Section C-C

Section B-B

Section C-C

SECTION B-B

SECTION C-C

ELECTRO-ABSORPTION MODULATOR WITH IMPROVED PHOTOCURRENT UNIFORMITY

TECHNICAL FIELD

This disclosure relates to performance improvements in electro-absorption modulators (EAMs).

BACKGROUND

Intensity modulation of optical signals in telecommunications applications is often achieved with electro-absorption modulators (EAMs). EAMs are semiconductor devices whose optical absorption characteristics can be changed by the application of an electrical field, allowing an incoming high-speed voltage signal to be converted into a high-speed optical signal. Integrated with a laser diode to provide the optical input, an EAM can form an optical data transmitter within a photonic integrated circuit (PIC). During operation, EAMs are subject to self-heating, which can entail performance degradation.

DETAILED DESCRIPTION

Figure 1A:
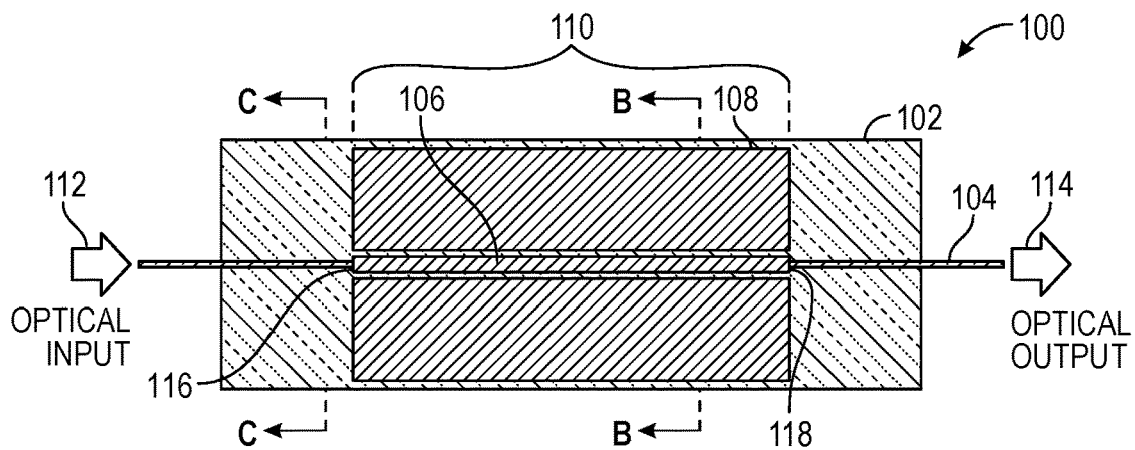
FIG. 1A is schematic top view of an example EAM.

The present disclosure relates to integrated EAMs with improved performance characteristics achieved by better photocurrent uniformity.

Integrated EAMs are usually structured as vertical diode mesas including a light-guiding intrinsic semiconductor layer sandwiched between p-type and n-type doped layers, disposed above a waveguide that couples light into and out of the intrinsic layer, and with electrical contacts on the top and at the side(s) of the mesa for applying a voltage across the intrinsic layer perpendicularly to the direction of light propagation; the region across which the voltage is applied forms the active region of the EAM, where modulation takes place. Silicon-photonics EAMs are commonly implemented with III-V materials bonded to a silicon-on-insulator (SOI) substrate, but EAMs are also widely implemented in other material platforms that do not involve attachment to an SOI substrate. In many implementations, the intrinsic layer includes a quantum well structure to exploit the quantum-confined Stark effect for high extinction ratios.

At the start of electro-absorption modulation of an optical signal, prior to self-heating, the absorption rate in the EAM is typically constant along the length of the active region, meaning that an approximately constant fraction of the optical power is absorbed every micrometer between the front (where light enters) and rear (where light exits) of the active region. However, as light propagates and is absorbed along the device (by generating photocurrent), the optical power decreases towards the rear, as does the current density of the generated photocurrent, which is a constant fraction of the optical power at a given location. As the EAM self-heats primarily at the front due to the higher photocurrent density at that location, the absorption rate at the front increases (due to the higher temperature), exacerbating the nonuniformity of the photocurrent density. In many cases, an electrical current density that is very high at the front end of the active region of the EAM and very low at the back end of the active region results. This nonuniform current density negatively affects the performance of the EAM, as it increases the voltage drop associated with the series resistance of the EAM in the regions with the highest photocurrent, such that a lower voltage swing remains across the intrinsic layer in the active region. The lower voltage swing, in turn, reduces the degree of electro-optic change and, thus, optical modulation amplitude (i.e., the difference between maximum and minimum power levels in the modulated optical signal) and extinction ratio (i.e., the ratio of maximum to minimum power levels of the modulated optical signal) of the EAM; in some instances, the photocurrent density at the front of the active region becomes so high as to result in a negligible extinction ratio, effectively reducing the length of the active region. At high optical powers (e.g., greater than 10 mW for an effective mode area of about 1 $\mu m^2$ or less) and associated high photocurrent density, EAM performance can be further impacted by carrier saturation at the front of the active region, which can reduce the electrical bandwidth of the device. High current density can also cause excessive self-heating (e.g., a temperature rise of more than 50° C.), resulting in component damage or reduced component operating lifetime. It is desirable to mitigate these various effects to achieve improved optical modulation amplitude, extinction ratio, bandwidth, and optical power handling.

Disclosed herein, in various embodiments, are EAM structures and associated calibration and operation methods that achieve a more uniform current density along the length of the active region of the EAM (i.e., in the direction of light propagation within the EAM), resulting in increased optical modulation amplitude and extinction ratio, greater bandwidth (enabling higher signal speeds), and better power handling (reducing the risk of thermal runaway and device failure). Some embodiments involve increasing the optical absorption coefficient of the EAM from the front of the active region towards the back to even out the photocurrent density. In one embodiment, this variation of the absorption coefficient along the active region is achieved by applying heat to the rear of the active region with an integrated heater, which raises the absorption coefficient in that region. In another embodiment, the EAM is equipped with metal contacts that provide two or more separately controlled direct-current (DC) bias voltages at different locations along the length of the active region, and the applied DC bias voltage is increased towards the rear of the active region to increase absorption. In a third embodiment, the material properties (e.g., elemental composition or quantum well dimensions) of the intrinsic layer are varied along the length of the active region, with the highest-absorbing material being located at the rear end. In another approach, instead of the absorption coefficient, the coupling of light into the EAM diode is varied along the length of the device, e.g., by having the front of the active region overlap with a down-tapered region of the (silicon) waveguide coupling light into the EAM diode. In the following, the various embodiments will be described in detail with reference to the accompanying drawings.

FIG. 1A is schematic top view of an example EAM 100, which includes an elongated diode structure 102 (illustrated in this figure by the outline of the bottom layer of the diode structure) disposed above a ridge waveguide 104 that couples light into and out of the diode structure 102. The EAM 100 further includes top and lateral electrical contacts 106, 108, whose extent along the length of the diode structure 102 defines the active region 110 of the EAM, where light modulation via an applied electrical signal takes place. The direction in which light propagates through the waveguide 104 and diode structure 102, indicated by the arrows 112, 114 for the optical input and the modulated optical output of the EAM 100, respectively, defines the front and rear end 116, 118 of the active region 110.

Figure 1B:
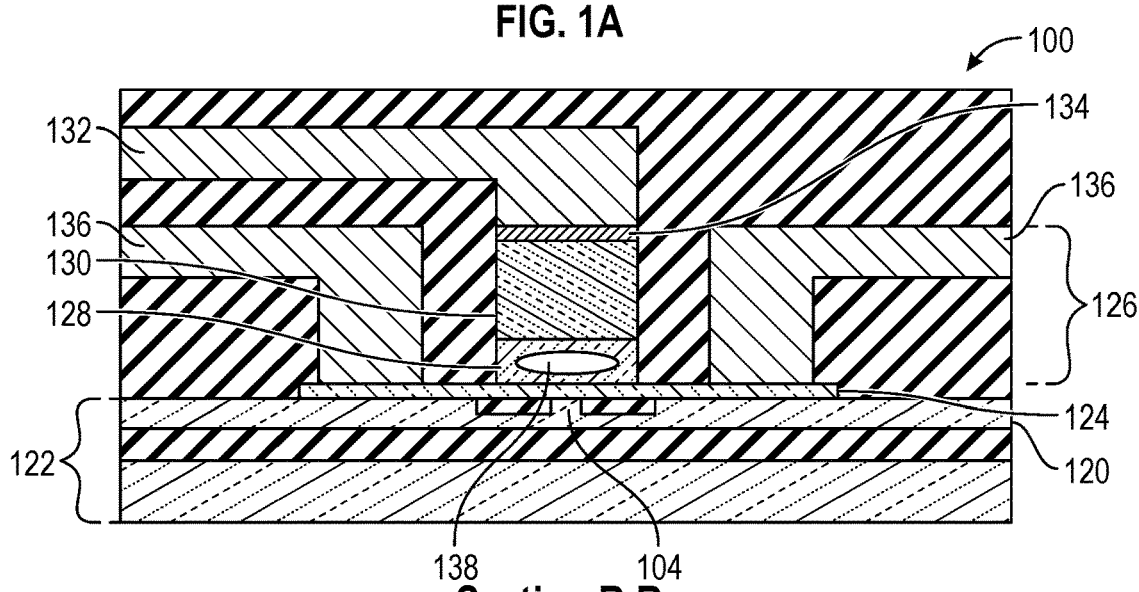
FIG. 1B is a schematic cross-sectional view through the active region of the EAM of FIG. 1A.
Figure 1C:
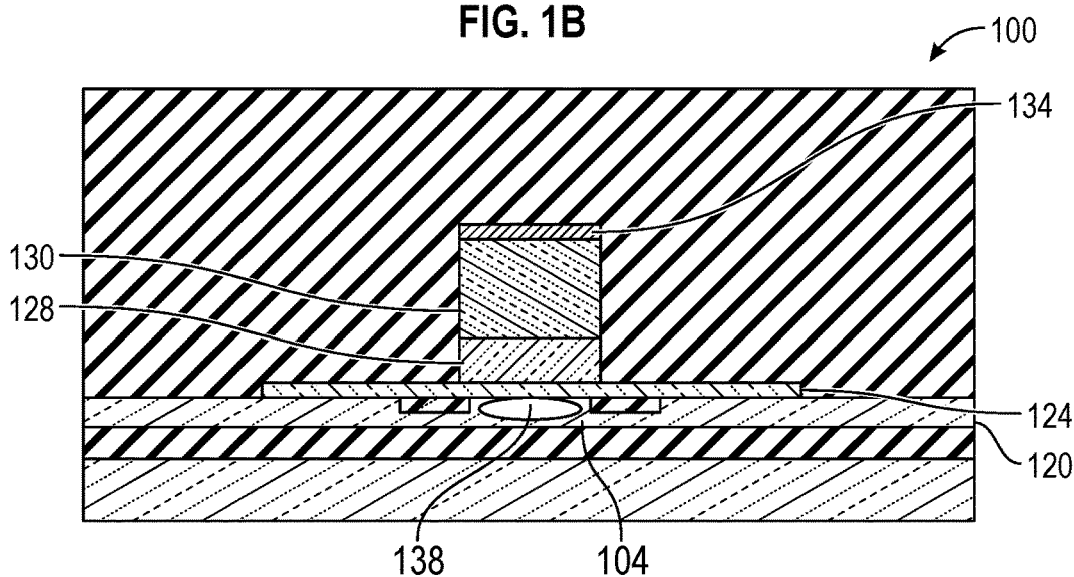
FIG. 1C is a schematic cross-sectional view through a region of the EAM of FIG. 1A adjacent the active region.

FIGS. 1B and 1C provide two schematic cross-sectional views of the example EAM 100, one taken through the active region 110 (FIG. 1B), and the other taken through a region adjacent (e.g., preceding or following) the active region 110. As shown, in this embodiment, the waveguide 104 is a rib waveguide formed in the device layer 120 of a semiconductor-on-insulator substrate 122, such as, e.g., a silicon-on-insulator (SOI) substrate including a silicon handle, buried oxide layer, and silicon device layer 120. Instead of silicon, the device layer 120 may, for instance, be a diamond or germanium layer. The diode structure 102, which may, optionally, be separated from the waveguide by a thin dielectric (e.g., oxide) layer (not shown), includes a doped bottom layer or "strip" 124 and, formed on top of the doped bottom strip 124, a layered mesa 126 (flat-top table-like structure), much narrower than the bottom strip 124 and elongated in the direction of light propagation to form a ridge above the waveguide 104. The mesa 126 includes an intrinsic layer 128 and a doped top layer 130. Although shown as equal in width, the intrinsic and doped top layers 128, 130 may alternatively differ in width, with a slightly wider or narrower intrinsic layer 128. The diode structure 102 may be made of compound semiconductor (i.e., semiconductor materials made from two or more elements), thus forming, together with the waveguide 104, a heterogeneous waveguide structure. Suitable compound semiconductors include, e.g., III-V materials (such as, e.g., indium phosphide (InP) or gallium arsenide (GaAs)) or II-VI materials (such as, e.g., cadmium selenide (CdSe) or zinc oxide (ZnO)). The intrinsic layer 128 may be made of a different semiconductor compound than the bottom and top layers 124, 130; for example, the diode structure 102 may include an intrinsic InAlGaAs layer in between doped InP layers. Further, the intrinsic layer 128 may be a bulk semiconductor layer, or may, alternatively, be composed of quantum wells, quantum dots, or quantum dashes. The EAM 100 can be made with standard semiconductor-fabrication techniques, such as by lithographic patterning and etching of the substrate 122 to create the waveguide 104, followed by bonding of a stack of compound-semiconductor material, and lithographic patterning and etching of the compound semiconductor to create the diode structure 102.

Functionally, the diode structure 102 is a p-i-n diode (with p-doped, intrinsic, and n-doped layers). The bottom layer 124 of the diode structure 102 is often n-doped and the top layer 130 p-doped (as hereinafter assumed for specificity), but the roles of the bottom and top layers 124, 130 as n-type and p-type layers may also be reversed. The EAM diode is reverse biased in operation, such that the terminal connected to the n-type layer (cathode) has a larger voltage than the terminal connected to the p-type layer (anode). In the active region 110 as shown in FIG. 1B, a p-type (ground or negative voltage) electrical terminal 132 provides the electrical top contact 106 with the p-type top layer 130 of the diode structure 102, either directly or via an optional p-type contact layer 134 disposed on top layer 130, and an n-type (positive or ground voltage) electrical terminal 136 establishes one or more lateral electrical contacts 108 with the bottom strip 124 on either or both sides of the mesa 126, likewise either directly (as shown) or optionally via a thin contact layer (not shown). The electrical terminals 132, 136 serve to apply a direct-current (DC) bias voltage and/or an alternating-current (AC), radiofrequency (RF) signal voltage for modulation across the diode. Structurally, the electrical terminals 132, 136 may be conductive vias implemented as vertical channels formed in a top cladding enclosing the diode structure 102, filled with a suitable metal (e.g., gold (Au), platinum (Pt), titanium (Ti), aluminum (Al), tungsten (W), titanium nitride (TiN), or zinc (Zn)) or other electrically conductive material.

In operation of the EAM 100, light is coupled from the (silicon) waveguide 104 into the intrinsic layer 128 of the diode structure 102 (which functions as a compound semiconductor waveguide) in a region at or immediately preceding the front 116 of the active region 110, and back from the diode structure 102 into the waveguide 104 at or immediately following the rear 118 of the active region 110. Such coupling is achieved by tapering the waveguide 104 between a greater width outside the active region 110, shown in FIG. 1C, and a smaller width inside the active region 100, shown in FIG. 1B. As conceptually illustrated in FIGS. 1B and 1C, in the active region 110, the optical mode 138 is carried primarily in the intrinsic layer 128, whereas, outside the active region (where the diode structure is not contacted by electrical terminal 132, 136), the optical mode 138 is carried primarily in the waveguide 104.

Figure 1D:
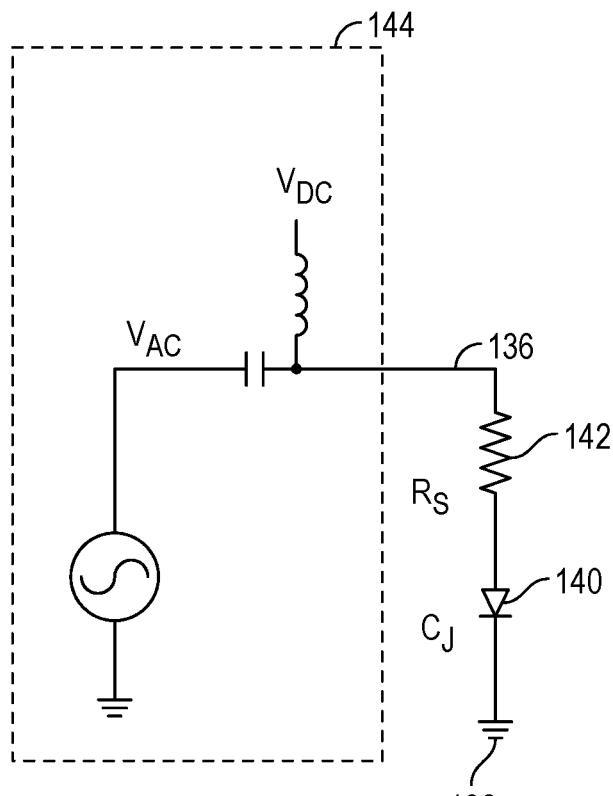
FIG. 1D is a simplified conceptual circuit diagram for the EAM of FIGS. 1A-1C.
Figure 1E:
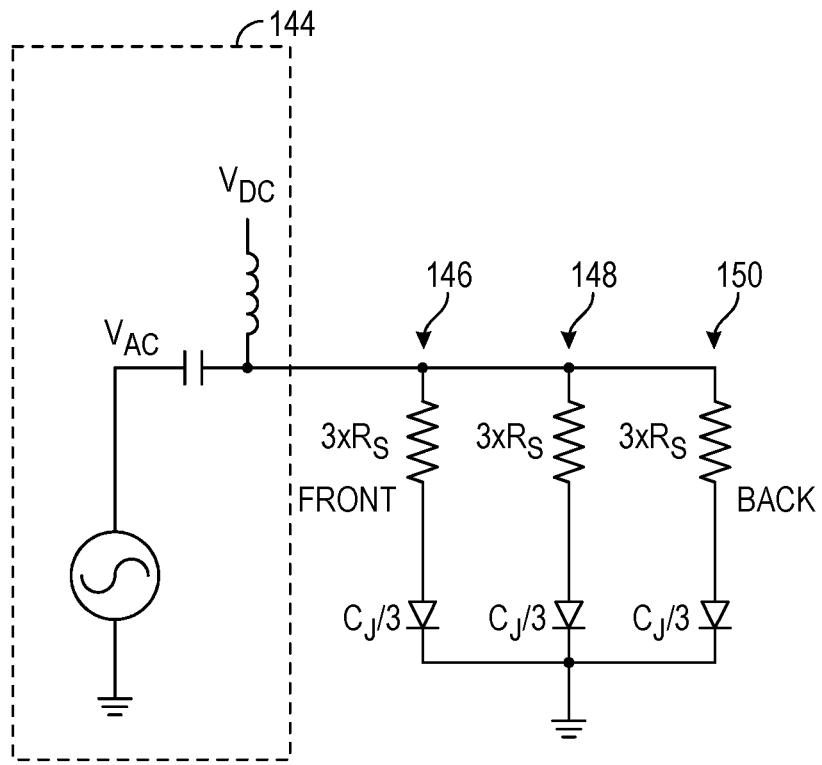
FIG. 1E is a conceptual circuit diagram for the EAM of FIGS. 1A-1C that represents the EAM diode by three parallel segments.

FIG. 1D is a simplified conceptual circuit diagram for the EAM of FIGS. 1A-1C. Herein, the diode structure 102 is represented by an ideal diode 140 with junction capacitance $C_J$ and an ohmic resistor 142 with series resistance $R_S$, connected between the positive terminal 136 and ground (providing the negative terminal) 132. A driver circuit 144 applies the DC bias voltage $V_{DC}$ and the AC modulation signal voltage $V_{AC}$. FIG. 1E is an another conceptual circuit diagram, which takes the physical extent of the diode structure 102 along the length of the active region 110 into account by representing the diode structure 102 with three parallel segments 146, 148, 150, each including an ideal diode and resistor in series. A third of junction capacitance $C_J$ and three times the series resistance $R_S$ are associated with each of the segments 146, 148, 150, for a total junction capacitance $C_J$ and series resistance $R_S$ of the three segments 146, 148, 150 together.

Figure 2:
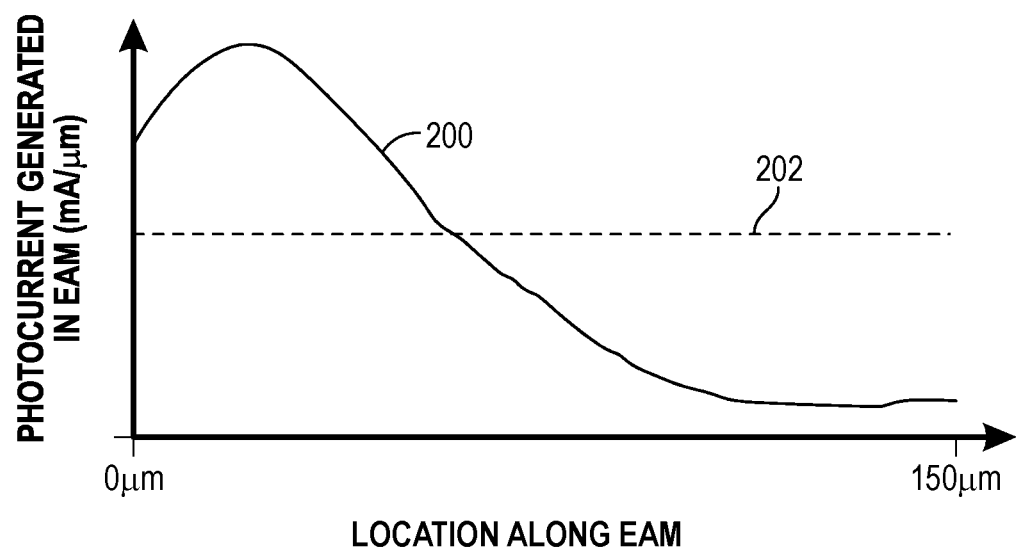
FIG. 2 is a graph of a nonuniform photocurrent density associated with an example EAM as shown in FIGS. 1A-1E.

FIG. 2 is a graph of a nonuniform photocurrent density 200 as is often associated with EAMs such as the EAM 100 shown in FIGS. 1A-1E. The photocurrent density 200 is plotted as a function of position along a 150 μm long active region, with 0 μm being the front and 150 μm being the back of the region. Also plotted, for comparison, is a uniform photocurrent density 202 corresponding to the average of the nonuniform current density 200. As can be seen, the nonuniform photocurrent density 200 in a front portion of the active region (e.g., corresponding to segment 146 in FIG. 1E) is high. As a consequence, the front portion experiences a high voltage drop through the series resistance and, accordingly, a reduced voltage swing over the EAM diode junction. This reduced voltage swing, in turn, results in a reduced optical transmission change in this region, and thus a reduced extinction ratio and optical modulation amplitude. In a back portion of the active region, the photocurrent density is low, causing a low voltage drop through the series resistance, and no impairment to the voltage swing over the EAM diode junction. Consequently, the extinction ratio in the back portion is good and the modulation amplitude high. However, the fraction of the optical power in the back is smaller than in the front, and, therefore, the high optical modulation amplitude in the back does not fully compensate for the degradation in optical modulation amplitude in the front. For a fixed input optical power, the EAM can provide a higher extinction ratio and optical modulation amplitude when the generated photocurrent (corresponding to the absorbed optical power) is uniform along the length of the active region.

In addition to decreasing EAM performance, the nonuniform photocurrent density can also result in excessive heating of the front portion of the active region, e.g., in a single hot spot that can go through thermal runaway, which is a well-known failure mode of EAMs. The risk of overheating limits the maximum optical power that can be coupled into the device. Another detriment of nonuniform photocurrent density is its effect on bandwidth. In general, the EAM bandwidth improves (i.e., increases, facilitating faster signal modulation) as the photocurrent increases, due to a lower microwave impedance. This increase with photocurrent continues until carrier build-up occurs in the quantum wells; once photogenerated carriers cannot be swept out quickly enough, the bandwidth degrades (resulting in slower signal modulation). Thus, the portion of the active region with the highest current density has the highest bandwidth until it saturates from charge build-up, but also the smallest voltage swing due to the series resistance voltage drop discussed above. The portion with the lower current density has a lower bandwidth and a larger voltage swing. A uniform photocurrent density creates a constant bandwidth along the active region, which may provide overall better device bandwidth than sections of high and low bandwidth.

Accordingly, to improve EAM performance in terms of optical modulation amplitude and bandwidth, and to counter the risk of overheating, EAMs are configured, in various embodiments, to achieve a more uniform photocurrent density.

Figure 3A:
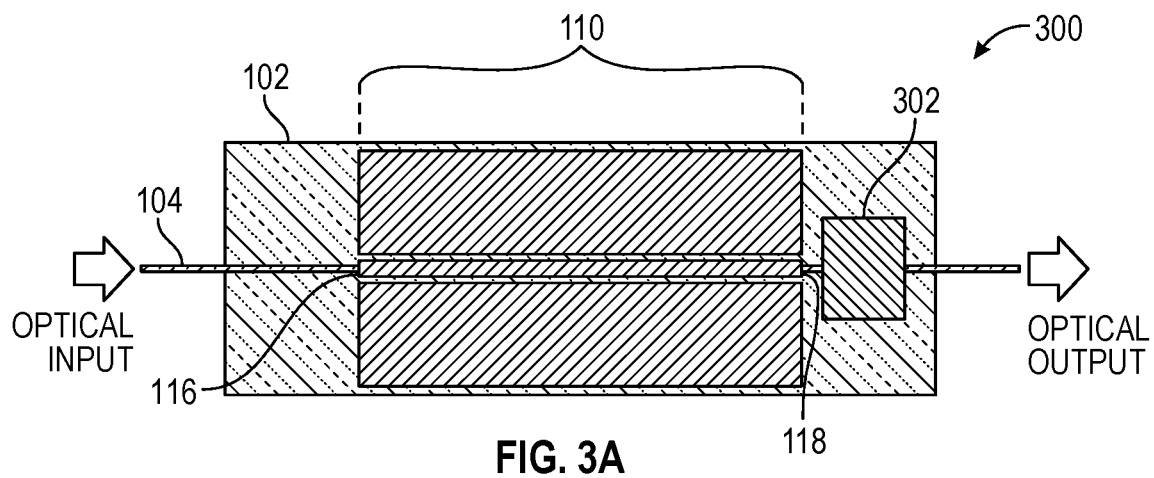
FIG. 3A is schematic top view of an example EAM including a heater at the rear end, in accordance with a first embodiment.

FIG. 3A is schematic top view of an example EAM 300 including, in accordance with a first embodiment, a heater 302 at the rear end of the diode structure 102, e.g., immediately following the rear 118 of the active region 110 (the EAM 300 otherwise being similar to the EAM 100 of FIG. 1). The heater 302 improves photocurrent uniformity by exploiting the increase in the optical absorption coefficient of the intrinsic layer 128 with increasing temperature. Placing the heater 302 at the back of the diode structure 102 causes the temperature to be higher in a rear portion of the active region 110 than in a front portion, resulting in a higher absorption rate in the rear portion, which counteracts the decrease in optical power from the front 116 to the rear 118 of the active region 110, and thus keeps the rate with which carriers are generated (corresponding to the photocurrent density) more uniform. In this manner, a heater 302 at the back can improve optical modulation amplitude and power handling (see also FIG. 9B described below).

While it is not uncommon to include a heater with an EAM, conventionally, such a heater serves to stabilize the EAM temperature (i.e., compensate for ambient temperature changes to maintain a constant EAM response despite such changes), and is typically placed laterally next to the center section of the active region. For temperature stabilization, heater placement at the back of the device would be inefficient. In its instant application for evening out the photocurrent density, on the other hand, placement of the heater 302 at the back is important to achieve the desired thermal gradient towards the rear 118 of the active region, with a concomitant improved optical absorption profile.

Figure 3B:
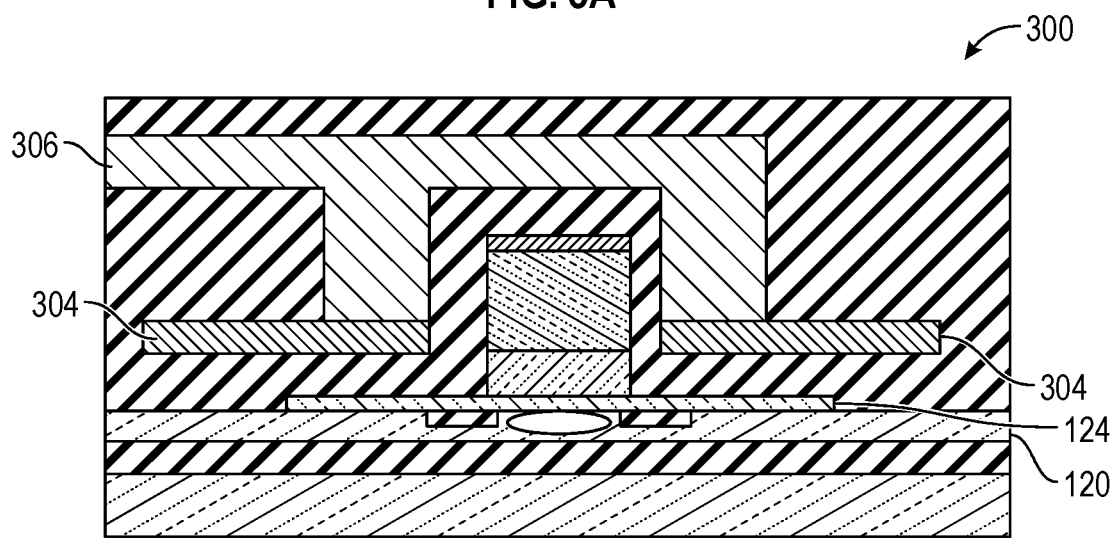
FIGS. 3B and 3C are schematic cross-sectional views of the EAM of FIG. 3A through the region of the heater at two locations along the heater, illustrating the electrical connections to the heater in accordance with one example.
Figure 3C:
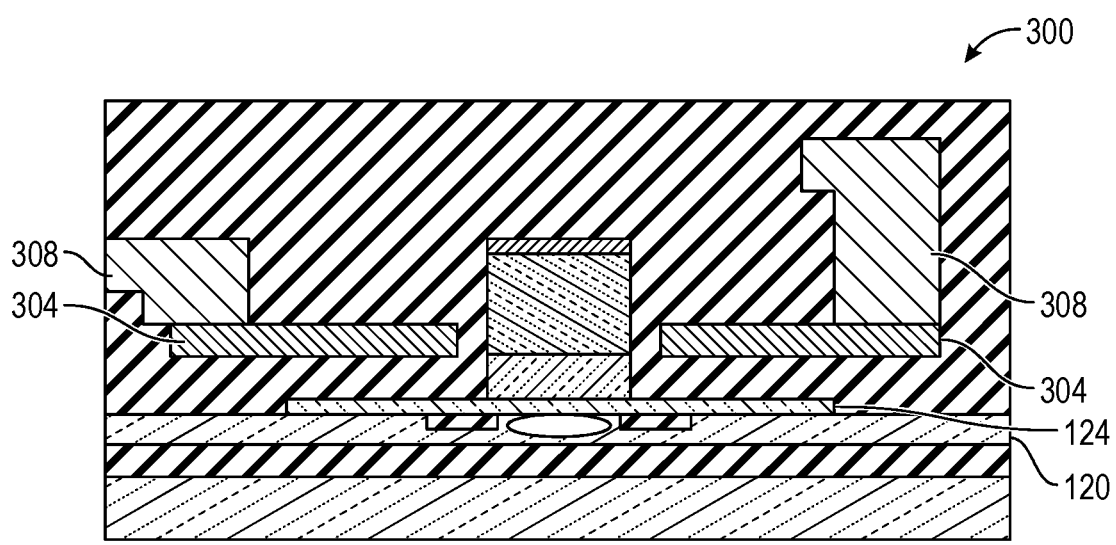
Figure 3D:
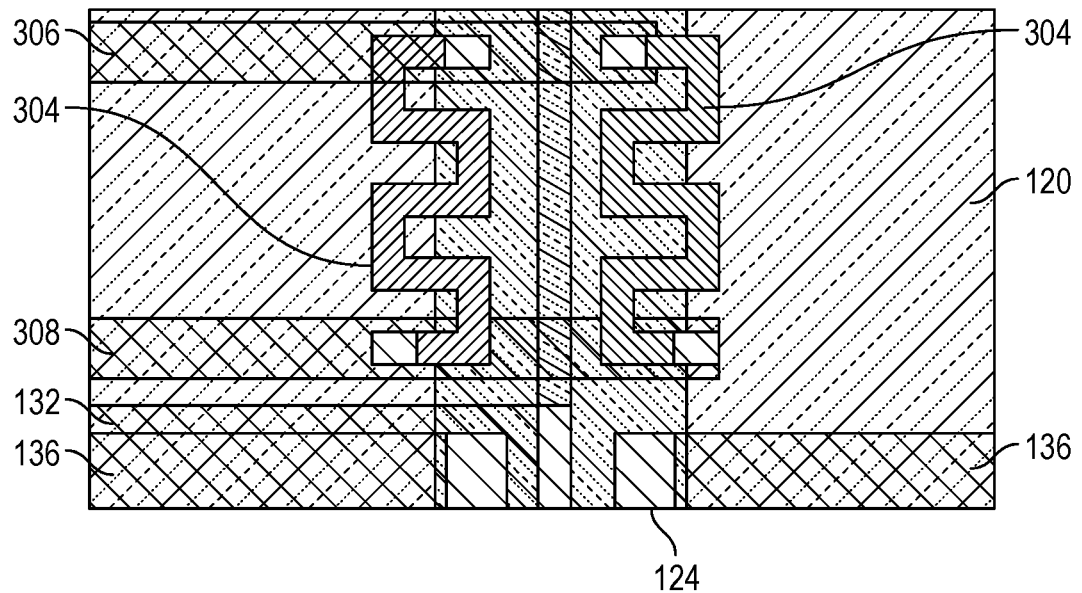
FIG. 3D is a more detailed top view of the EAM of FIG. 3A in the region of the heater, illustrating a heater configuration in accordance with one example.

FIGS. 3B-3C and 3D provide schematic cross-sectional views and a more detailed top view, respectively, of the EAM 300 in the region of the heater 302 (e.g., a region at the back of the diode structure 102, following the active region 110); collectively, FIGS. 3B-3D illustrate an example heater configuration and associated electrical connections. As shown in FIG. 3D, the heater 302 may include winding heater filaments 304 to both sides of the diode mesa 126, each running across a rectangular region disposed, parallel to the substrate, above the bottom strip 124 of the diode structure 102 and the surrounding device layer 120. The heater filaments 304 may be made of a metal or metal alloy such as, e.g., tungsten, platinum, titanium-nitride, nickelchrome, etc. A heater terminal 306 of one (e.g., positive) polarity, shown in FIG. 3B, contacts the heater filaments 304 on one end, farther away from the active region 110; and a heater terminal 308 of the other (e.g., negative) polarity, shown in FIG. 3D, contacts the heater filaments 304 at the other end, closer to the active region 110. For reference, the locations of the electrical terminals 132, 136 contacting the top and bottom layers 130, 124 of the diode structure 102 are also indicated. Although the use of two heater filaments 304 is beneficial for heating the active region effectively and symmetrically (about the waveguide 104), the heater 302 may, in principle, also be implemented with only one heater filament 304.

Figure 3E:
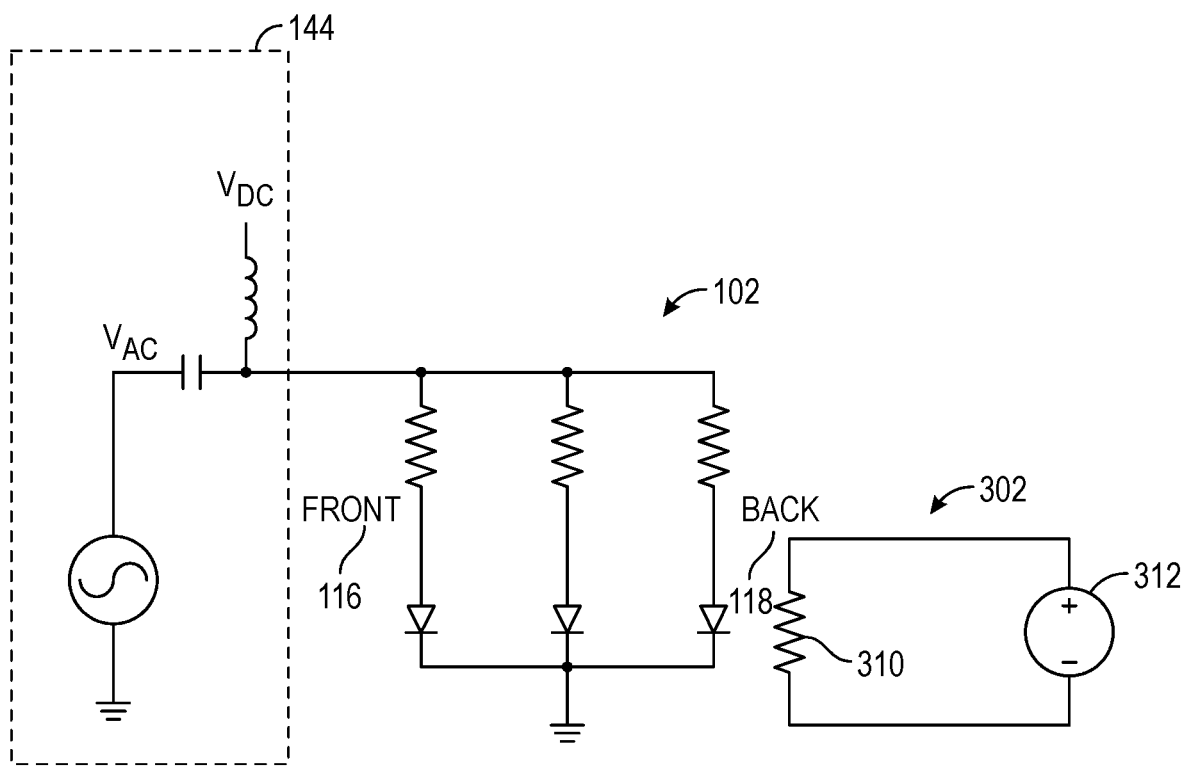
FIG. 3E is a conceptual circuit diagram for the EAM of FIGS. 3A-3D.

FIG. 3E is a conceptual circuit diagram for the EAM of FIGS. 3A-3D. As shown, the EAM 300 with heater 302 can be represented by two separate electrical circuits: One circuit corresponds to the EAM diode structure 102 (here represented, as in FIG. 1E, by three parallel segments each including an ideal diode and resistor in series) and associated driver circuit 144. The other circuit, which is not electrically connected to the diode circuit, corresponds to the heater 302, represented by an ohmic resistor 310, which is placed in physical proximity to the rear end 118 of the active region 110 of the diode, and its power supply 312.

Figure 4A:
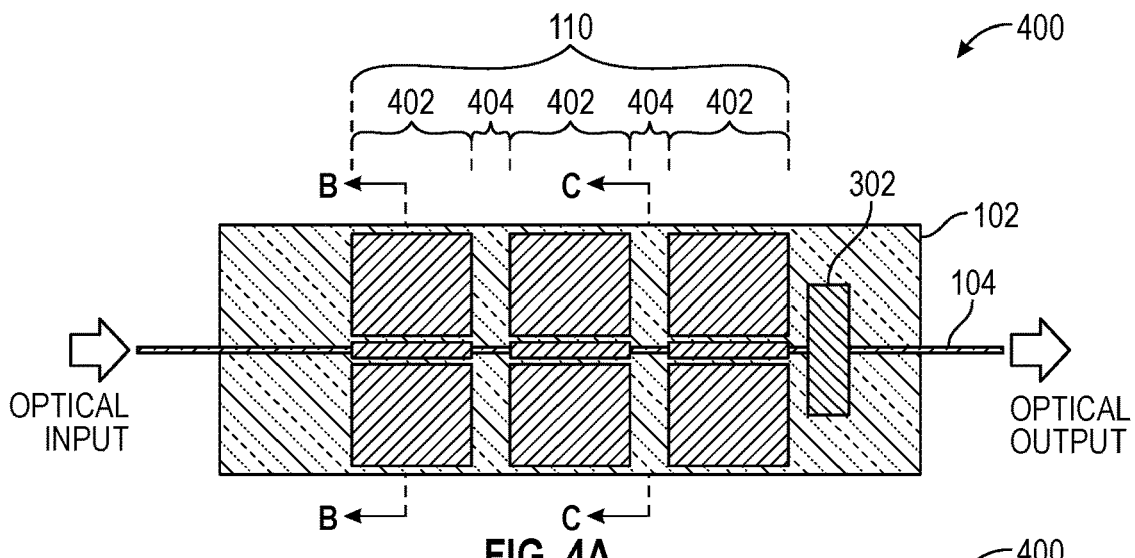
FIG. 4A is a schematic top view of an example EAM with multiple bias voltages, in accordance with a second embodiment.
Figure 4B:
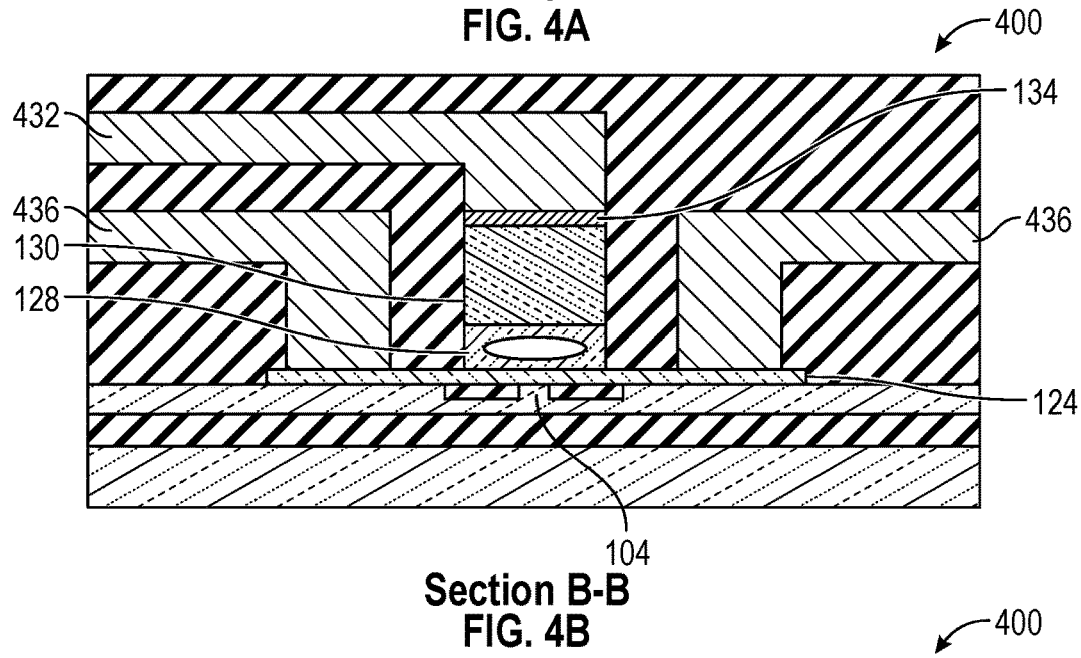
FIG. 4B is a schematic cross-sectional view of the EAM of FIG. 4A through an electrical contact region.
Figure 4C:
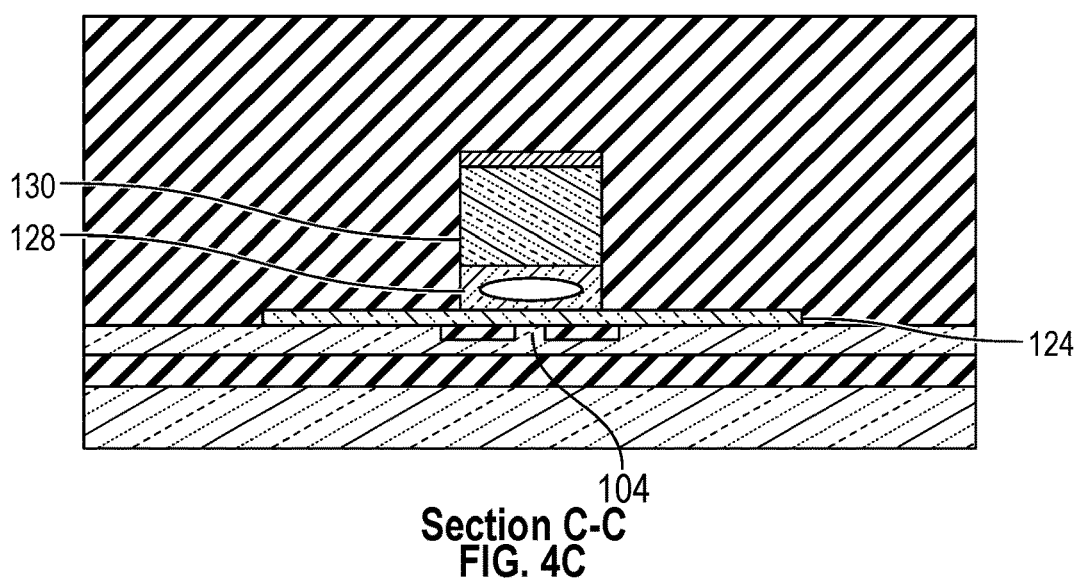
FIG. 4C is a schematic cross-sectional view of the EAM of FIG. 4A through an electrical isolation region.

FIG. 4A is a schematic top view of an example EAM 400 with multiple bias voltages, in accordance with a second embodiment. In this EAM 400, the metal contacts on the top and bottom layers of the diode structure 102 are broken up, along the length of the active region 110, into multiple segments (e.g., as illustrated, three segments) forming (three) separate electrical contact regions 402. The electrical contact regions 402 are separated by electrical isolation regions 404. Within each of the contact regions 402, as shown in FIG. 4B in a schematic cross-sectional view, negative and positive electrical terminals 432, 436 contact the top and bottom layers 130, 124, respectively, of the diode structure 102 (directly or indirectly, e.g., via top contact layer 134) to apply a bias voltage across the diode structure 102. For an active region 110 of a given length, the terminals 432, 436 are shorter (in the direction along the length of the active region 110) than the terminals 132, 136 of the conventional EAM 100, but, otherwise, they may be similar. In each of the electrical isolation regions 402, as shown in FIG. 4C in a schematic cross-sectional view, there simply are no electrical terminals establishing contact with the top and bottom layers 130, 124 of the diode structure 102. As shown in FIG. 4A, the EAM 400 may, in addition to using multiple DC bias voltages, include a heater 302 at the rear.

Figure 4D:
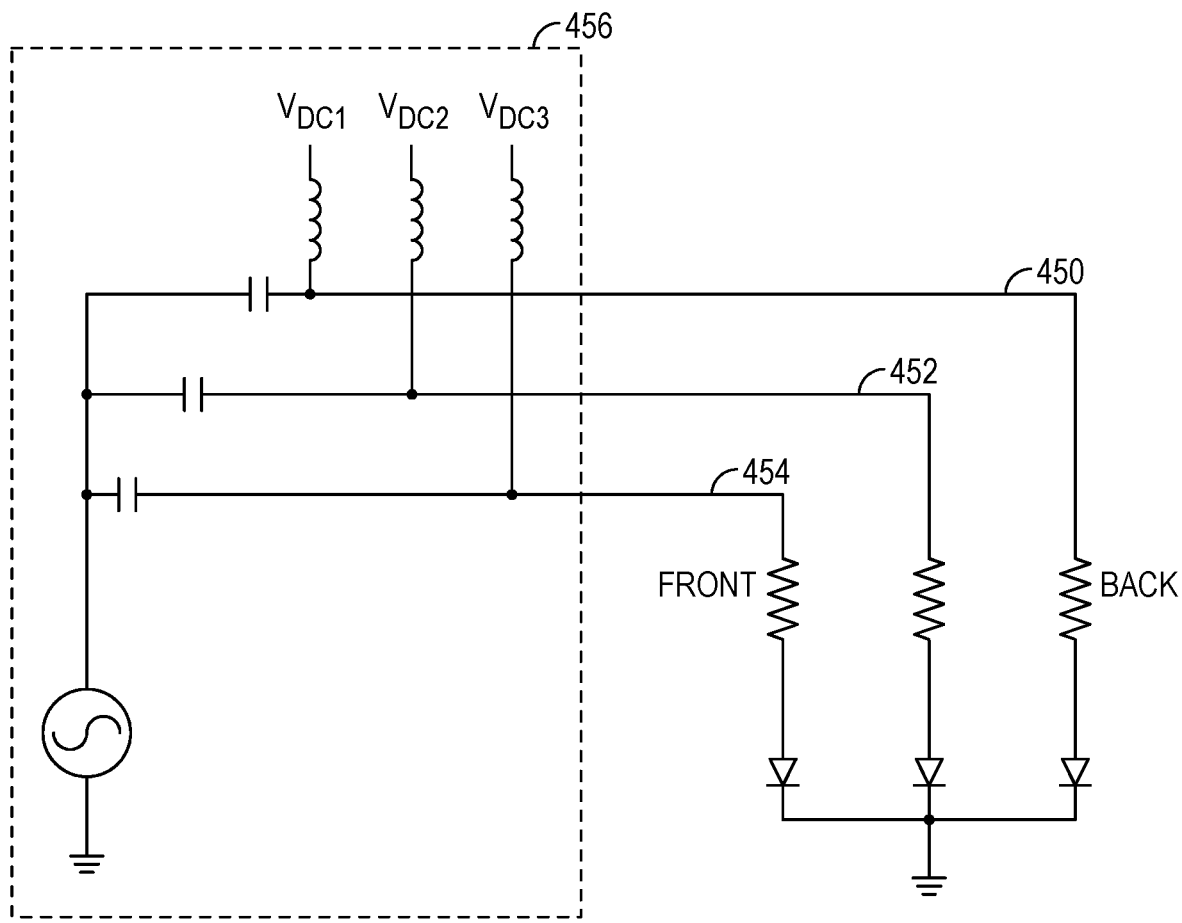
FIG. 4D is a conceptual circuit diagram for the EAM of FIGS. 4A-4C.

FIG. 4D is a conceptual circuit diagram for the EAM 400 of FIGS. 4A-4C. The EAM diode structure 102 is again represented by three segments, each including an ideal diode and series resistor. However, the segments, corresponding to the three electrical contact regions 402, are now connected to their own respective terminals 450, 452, 454, such that three separate DC bias voltages $V_{DC1}$, $V_{DC2}$, $V_{DC3}$ can be applied to the diode structure in the respective contact regions. The higher the bias voltage, the greater is the absorption coefficient in the diode structure. Therefore, to even out the photocurrent density along the active region, the driver circuit 456 applies the highest bias voltage (i.e., largest reverse bias voltage over the EAM diode) to terminal 450 contacting the back of the active region, and the lowest bias voltage (i.e., smallest reverse bias voltage over the EAM diode) to terminal 454 contacting the front of the active region. The high-speed AC signal voltage can be the same for all contact regions, as shown in FIG. 4D. Alternatively, different signal levels may be applied to different contact regions, using a distributed, multi-terminal driver.

Figure 5A:
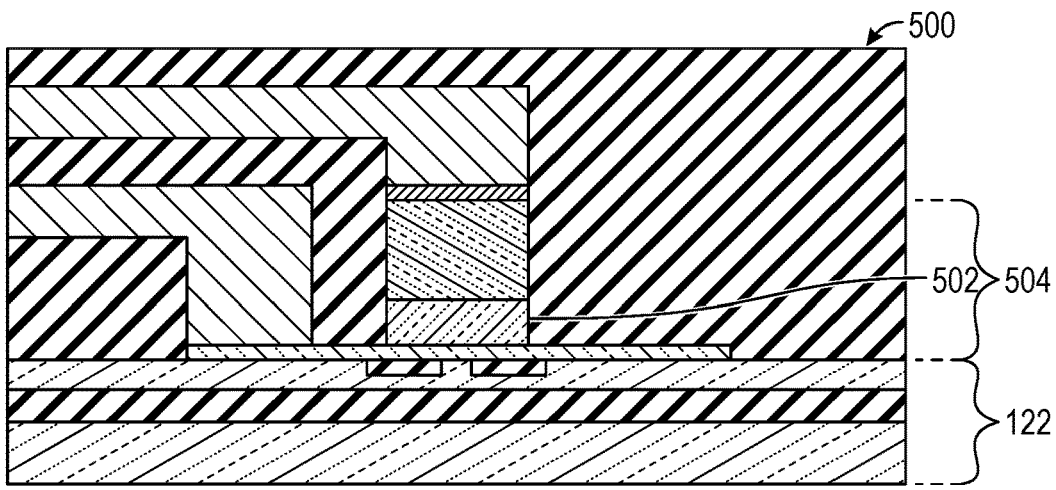
FIG. 5A is a schematic cross-sectional view at the front of the active region of an example EAM with varying material composition in accordance with a third embodiment.
Figure 5B:
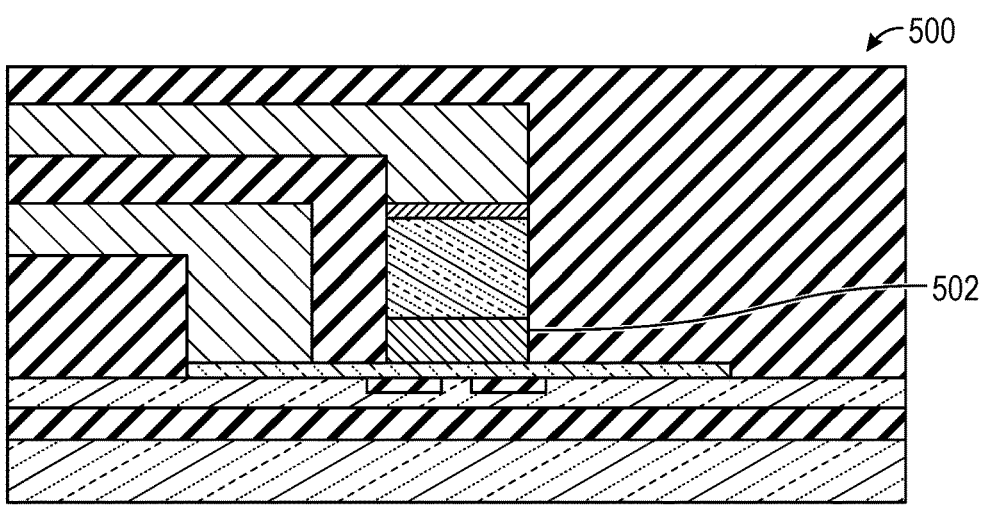
FIG. 5B is a schematic cross-sectional view in the middle of the active region of the example EAM of FIG. 5A.
Figure 5C:
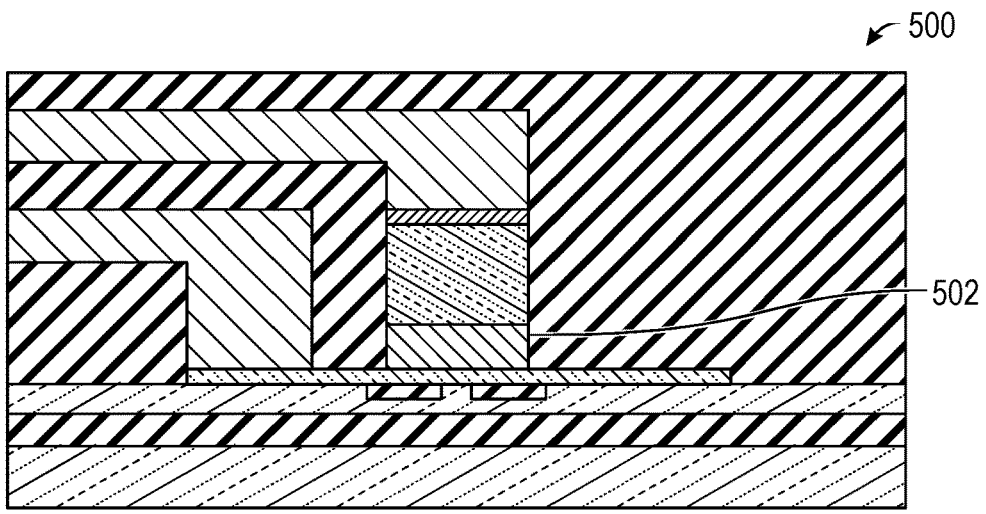
FIG. 5C is a schematic cross-sectional view at the rear of the active region of the example EAM of FIG. 5A.
Figure 5D:
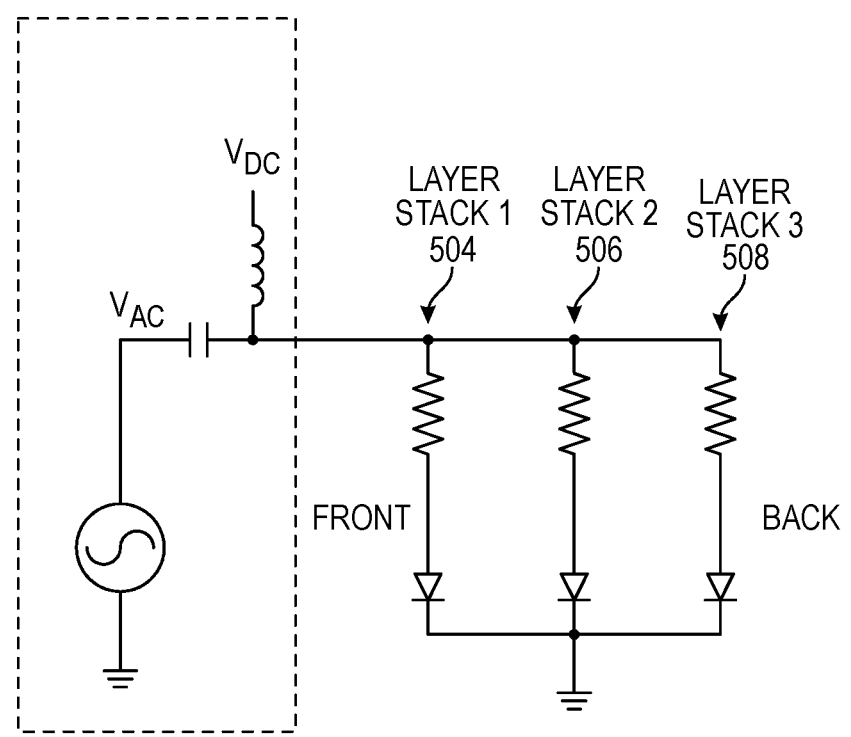
FIG. 5D is a conceptual circuit diagram for the EAM of FIGS. 5A-5C.

FIGS. 5A-5D illustrate an example EAM 500 with an intrinsic layer 502 whose material composition changes along the length of the active region, in accordance with a third embodiment. FIGS. 5A, 5B, 5C are schematic cross-sectional views taken through a region at the front of the active region, a region in the middle of the active region, and a region at the rear of the active region, respectively. As can be seen, the structure of the EAM 500, including the layered diode structure 504, may be constant along the length of the active region, except for the material that makes up the intrinsic layer 502, which varies between the cross sections (as depicted by different shadings). FIG. 5D is a conceptual circuit diagram for the EAM 500, again representing the diode structure as three parallel segments 504, 506, 508, and indicating that each segment corresponds to a different layer stack in the diode structure 102 (with FIG. 5A showing the stack for front segment 504, FIG. 5B showing the stack for middle segment 506, and FIG. 5C showing the stack for rear segment 508). The materials in the different regions of stacks along the active region are selected such that optical absorption is highest at the back of the active region.

Variability in the intrinsic-layer material can be achieved by changing the elemental composition of the layer 502. For example, a quantum well structure in the intrinsic layer 502 may have an elemental composition including gallium (Ga), indium (In), arsenic (As), and phosphorous (P), in proportions specified by the formula $Ga_xIn_{1-x}As_yP_{1-y}$, where the quantum well absorption, and thus the optical absorption coefficient, changes with x and y. Thus, a gradient in the absorption coefficient can be created by changing x and y along the length of the active region, and photocurrent nonuniformity can be compensated for by locating the highest-absorbing material at the rear. Apart from varying elemental composition, the absorption characteristics of an intrinsic quantum well layer, which is generally structured as a stack of quantum wells alternating with barrier sub-layers, can also be modified by varying the quantum well number in the stack or the quantum well thickness. For example, the EAM III-V material could contain seven 7 nm thick quantum wells at the start of the EAM and 10 nm thick quantum wells at the end of the EAM; with the barrier and separate-confinement-heterostructure layer thicknesses or composition adjusted to minimize modal refractive index changes between these regions to prevent optical reflections. The EAM quantum well thickness may vary, e.g., within the range from 4-20 nm, depending on material design. Similarly, for bulk quaternary, quantum dash, and quantum dot layers, thickness and/or elemental composition may be changed along the length of the active region to effect a variation in optical absorption. For bulk material, this is done by shifting the $Ga_xIn_{1-x}As_yP_{1-y}$ composition such that the EAM material bandgap moves closer to the operating wavelength towards the back of the EAM (e.g., starting from a bandgap wavelength 90 nm below the operating wavelength at the start of the EAM and moving to 80 nm below the operating wavelength at the end). For quantum dashes and dots, the variation in optical absorption can be achieved by increasing the thickness or density of the dash and dot layer, and modifying the composition of surrounding layers or reducing the surrounding layer thicknesses to keep the modal refractive index roughly constant.

A diode structure 504 with an intrinsic layer whose material properties vary along one dimension can be made by bonding a single epi piece (i.e., piece of epitaxially grown layers, e.g., singulated or cleaved from a compound semiconductor wafer with varying compound-semiconductor (e.g., III-V) material composition to the substrate 122 (followed by patterning the epi piece to create the mesa). The material variation in the epi piece is achieved by varying material properties across a wafer during material growth prior to singulation into epi pieces.

Figure 6:
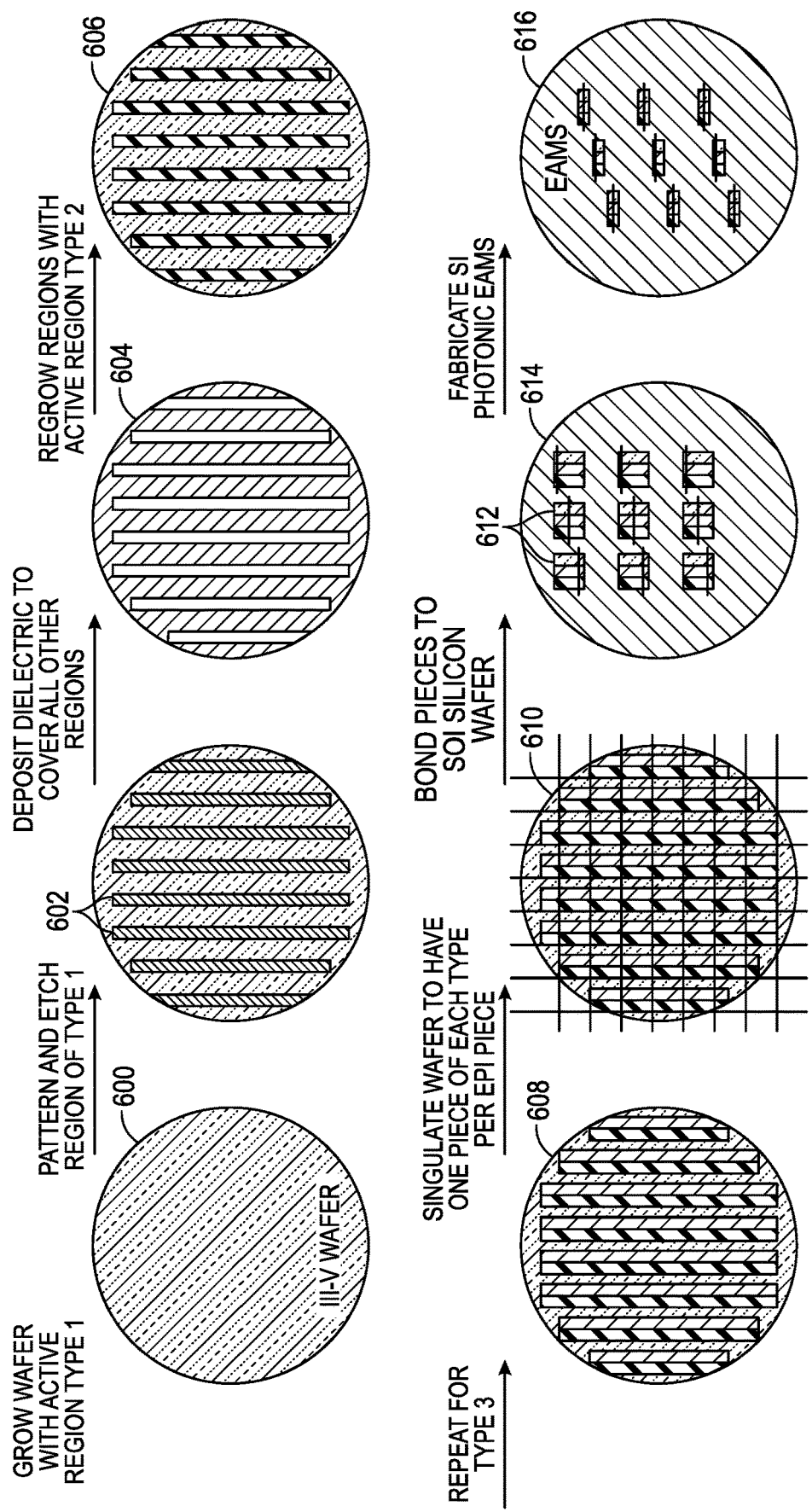
FIG. 6 is a sequence of wafer top views illustrating steps of manufacturing EAM diodes with varying material composition in accordance with the third embodiment.

FIG. 6 is a sequence of wafer top views illustrating steps of manufacturing EAM diodes 500 with varying material composition in accordance with the third embodiment. The first step in manufacturing is to (epitaxially) grow a III-V (or other semiconductor compound) wafer 600 with an active region of type 1. The wafer 600 is patterned using photoresist and lithography (a dielectric deposition before the photoresist and etch after lithography may optionally be added) and etched to create channels 602 in the surface of the wafer, removing the type 1 material. The photoresist is then removed, dielectric is deposited over the wafer, photoresist is reapplied and lithography is repeated to redefine equal or slightly larger channels 604 over the type 1 areas. Note that this step may be combined with the preceding step if a dielectric mask is used during that step; the decision is typically based on wafer cleaning requirements prior to regrowth. Active regions of type 2 are (epitaxially) regrown in the exposed regions of the channels and the dielectric mask is removed, resulting in a wafer 606 that includes two types of active regions. The patterning and etch of the type 1 material adjacent to the type 2 material, and application of dielectric and the regrowing of an active region are then repeated for type 3, which achieves a periodic variation across the wafer 608 between three materials. The finished wafer may optionally go through chemical mechanical polishing (CMP) to remove any height variation, especially at the interfaces between material types, which can interfere with bonding. The completed wafer may be planar with height variation on the surface of less than 1 nm root-mean-square over each region to be bonded. The wafer can now be singulated, as shown at 610, into III-V epi pieces 612 all characterized by a stepwise variation in its materials along one direction. These epi pieces 612 are then bonded to a patterned SOI wafer 614, which can be further processed to create an EAM diode structure in each of the bonded epi pieces. The resulting SOI wafer 616 can be diced into multiple EAM devices. While FIG. 6 illustrates how EAMs with three different material regions are created, it will be evident to those skilled in the art that the process can be extended to any number of different material regions. In practice, EAMs with only a few (e.g., two or three or four) different intrinsic-layer regions along the EAM generally suffice to achieve photocurrent uniformity in accordance with this disclosure, and finer gradations may, accordingly, result in unnecessary cost.

The foregoing approaches all achieve, by various means, an increase of the optical absorption towards the rear of the EAM, counteracting the decrease in optical power in that direction. In the following, an alternative concept, in which light is coupled continuously from the silicon waveguide into the intrinsic layer of the diode over a portion of the EAM, is described.

Figure 7A:
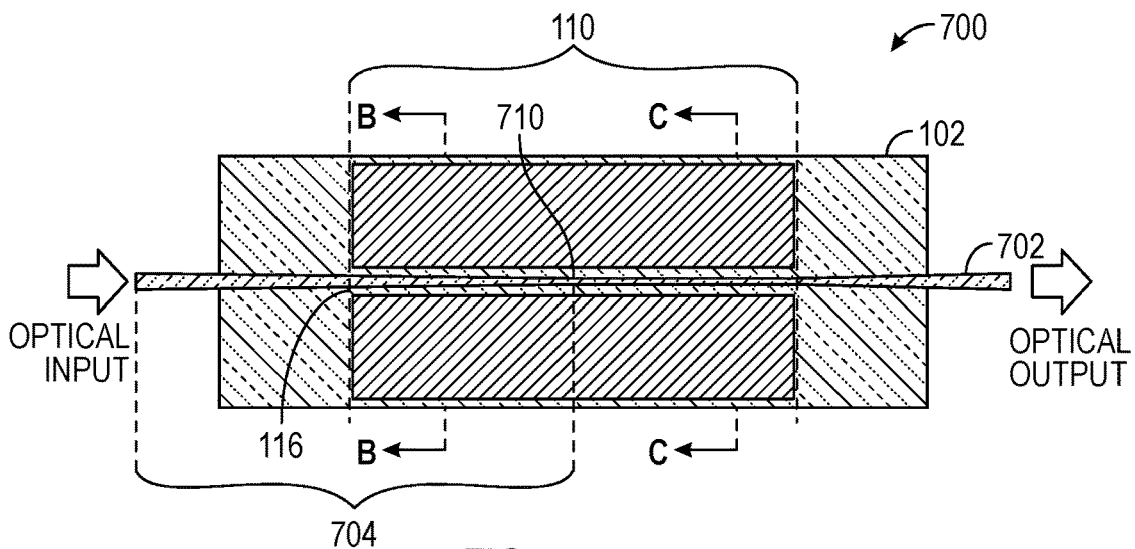
FIG. 7A is a schematic top view of an example EAM having its active region overlapping with a tapered region of the waveguide coupling light into the EAM diode, in accordance with a fourth embodiment.
Figure 7B:
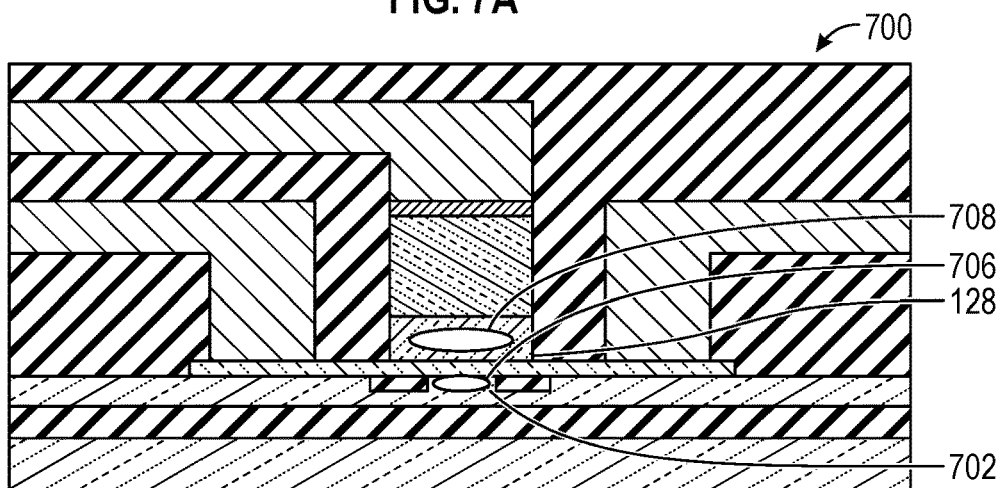
FIG. 7B is a schematic cross-sectional view of the EAM of FIG. 7A at the front of the active region.
Figure 7C:
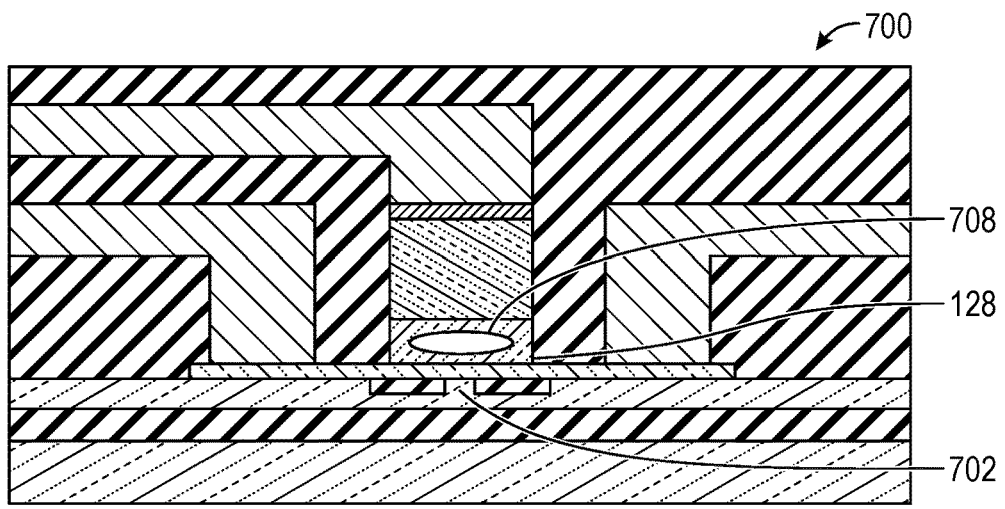
FIG. 7C is a schematic cross-sectional view of the EAM of FIG. 7A at the rear of the active region.

FIG. 7A is a schematic top view of an example EAM 700 having its active region 110 overlapping with a tapered section of the (silicon) waveguide 702 coupling light into the EAM diode, in accordance with a fourth embodiment. Ordinarily, the (silicon) waveguide of an EAM (such as EAMs 100, 300, 400, 500) tapers down (that is, decreases in width) in a section overlapping with the diode mesa (compound semiconductor waveguide), but preceding the active region 110, where modulation occurs. Thus, at the front end 116 of the active region 110, the optical mode is usually carried predominantly in the intrinsic layer of the compound semiconductor waveguide, with only minimal if any light remaining in the (silicon) waveguide. In the EAM 700 depicted in FIG. 7A, by contrast, the down-tapered section 704 of the waveguide significantly overlaps with the active region 110 (e.g., by at least 10% the length of the active region). As a result, as shown in the cross-section of FIG. 7B, the waveguide 702 still carries an optical mode 706 and at least 10% of the total optical power as it reaches the start 116 of the active region 110. As the waveguide further decreases in width in the direction of light propagation, this optical mode 706 is gradually coupled into the intrinsic layer 128 of the diode structure 102, replenishing the optical power of the optical mode 708 that is guided in the intrinsic layer 128 and absorbed along the way to create photocurrent. With this configuration, the photocurrent density at the front of the active region 110 is reduced (compared with a configuration in which all light has been coupled into the intrinsic region 128 at the front of the active region 110), for the benefit of increased photocurrent density at locations closer towards the rear, which tends to even out the photocurrent density along the length of the device. The length of the overlap between the down-tapered section 704 of the waveguide 702 and the active region 110, and the rate at which the width of the waveguide 702 decreases along that length, may be optimized for the best achievable photocurrent uniformity. For example, in one embodiment, as illustrated, the waveguide 702 is designed such that, at or near the middle 710 of the active region 110, all light has been coupled into the intrinsic layer 128, and the down taper of the (silicon) waveguide 702 may end there. In the rear portion of the active region 110, therefore, the optical mode 708 is entirely in the intrinsic layer 128, as shown in the cross-sectional view of FIG. 7C.

Figure 8:
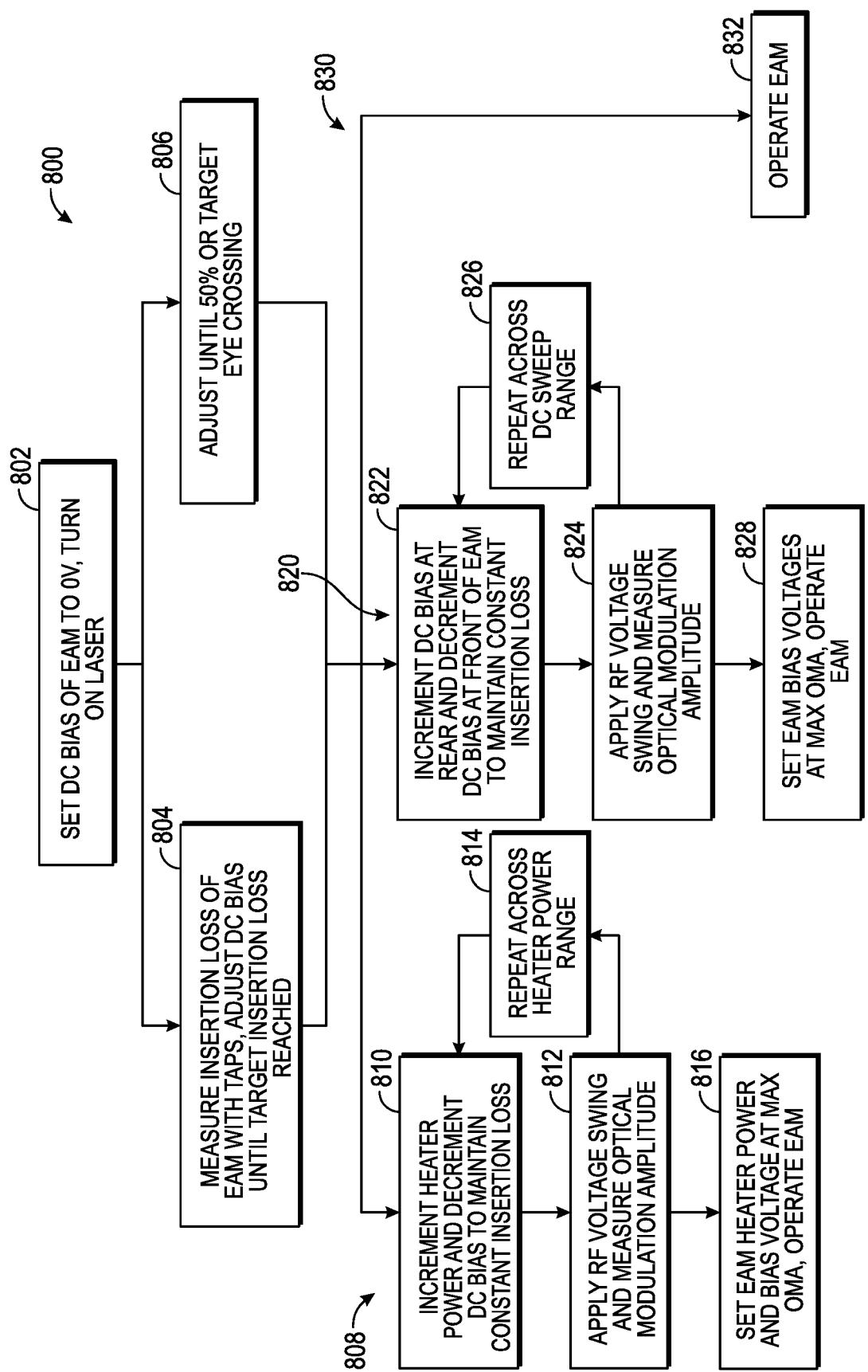
FIG. 8 is a flow chart of methods of calibrating the operating setpoint of an EAM in accordance with various embodiments.

Having described various structural embodiments of EAM devices designed for a more uniform photocurrent density (e.g., devices 300, 400, 500, 700), methods 800 of calibrating and operating such devices will now be described with reference to the flow chart shown in FIG. 8. The calibration generally begins with setting the DC bias of the EAM to 0V, and turning on the laser to operating power (802). The insertion loss of the EAM (which is 1 minus the fraction of the optical input power that reaches the output) can then be measured, e.g., using optical taps before and after the EAM, and the DC bias voltage can be adjusted until the target insertion loss is reached (804). The subsequent procedure then serves to set the device to the maximum optical modulation amplitude at the set fixed optical loss (where the fixed optical loss can be easily measured through pre- and post-EAM taps, without the RF voltage swing turned on). Alternatively, with the RF voltage swing turned on, the following procedure can serve to set the device to the maximum optical modulation amplitude at a set eye crossing value. The DC bias voltage may be adjusted until 50% or a target eye crossing is reached (806), where the eye crossing is defined as, $$\text{Eye Crossing (\%)} = \frac{(P_{optical\ at\ crossing} - P_{optical\ at\ 0-level})}{(P_{optical\ at\ 1-level} - P_{optical\ at\ 0-level})},$$

and $P_{optical\ at\ crossing}$ is the optical power on an eye diagram where the rising 0-to-1 crosses the falling 1-to-0 level optical pattern on an oscilloscope. The eye crossing may be measured on a benchtop oscilloscope tool such as a digital communication analyzer (DCA), or through an eye monitor circuit built into a post-EAM tap. For digital communication, an eye crossing between 40-60% typically provides the highest bit-error-rate for a fixed RF swing voltage and optical power. The fixed insertion loss method requires less measurement time and is roughly correlated to eye crossing; thus, it can provide much faster modulator calibration, but it is less accurate for a specific eye crossing value.

Depending on the approach taken to achieve greater uniformity in the photocurrent density, different calibration sequences may then be performed to determine the operating setpoint of the EAM. For an EAM 300 with a heater at the rear (branch 808), the heater power is increased by small increments, and the bias voltage is concomitantly decreased to maintain the fixed target insertion loss (810). An RF voltage swing (i.e., AC signal voltage) is then applied to the EAM 300, and the optical modulation amplitude of the output optical signal is measured (812). This process (810, 812) is repeated across the full heater power range (814). In the end, the heater power and corresponding DC bias voltage are set to their values at which the optical modulation amplitude is maximized, and the EAM 300 is operated at that setpoint (816). Similarly, for an EAM 400 with segmented electrical terminals to apply multiple bias voltages along the length of the device (branch 820), the DC bias voltage at the rear end of the active region is increased in small steps as the DC bias voltage at the front of the active region is decreased to maintain the set optical insertion loss (822). An RF voltage swing is then applied across the EAM 400, and the optical modulation amplitude of the output optical signal is measured (824). This process (822, 824) is repeated across the full DC voltage sweep range (which may be, e.g., 1V) (826). The DC bias voltages are then set to the combination of values achieving the maximum optical modulation amplitude, which serves as the setpoint for operating the EAM 400 (828). For EAMs 500, 700 that achieve uniform photocurrent density based on their fixed design features (material variation along the active region, or silicon waveguide overlap with the active region) (branch 830), no further calibration is to be performed, and the EAM 500, 700 is simply operated (832).

Figure 9A:
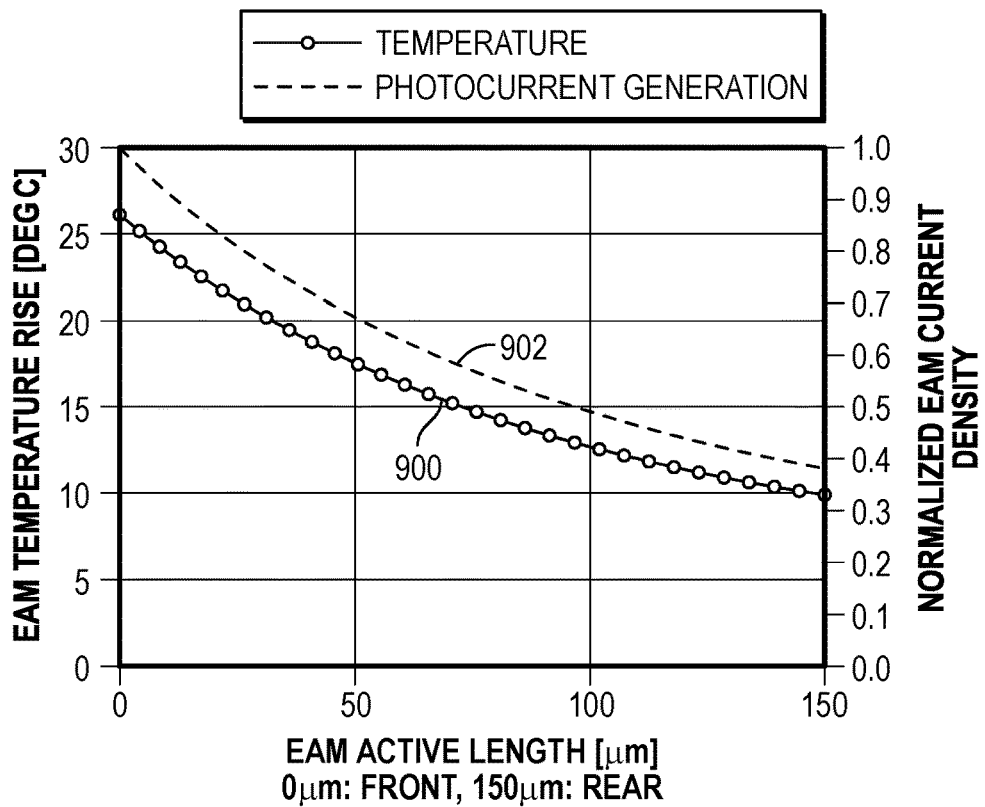
FIG. 9A is a graph of the temperature and normalized photocurrent density along an example conventional EAM.
Figure 9B:
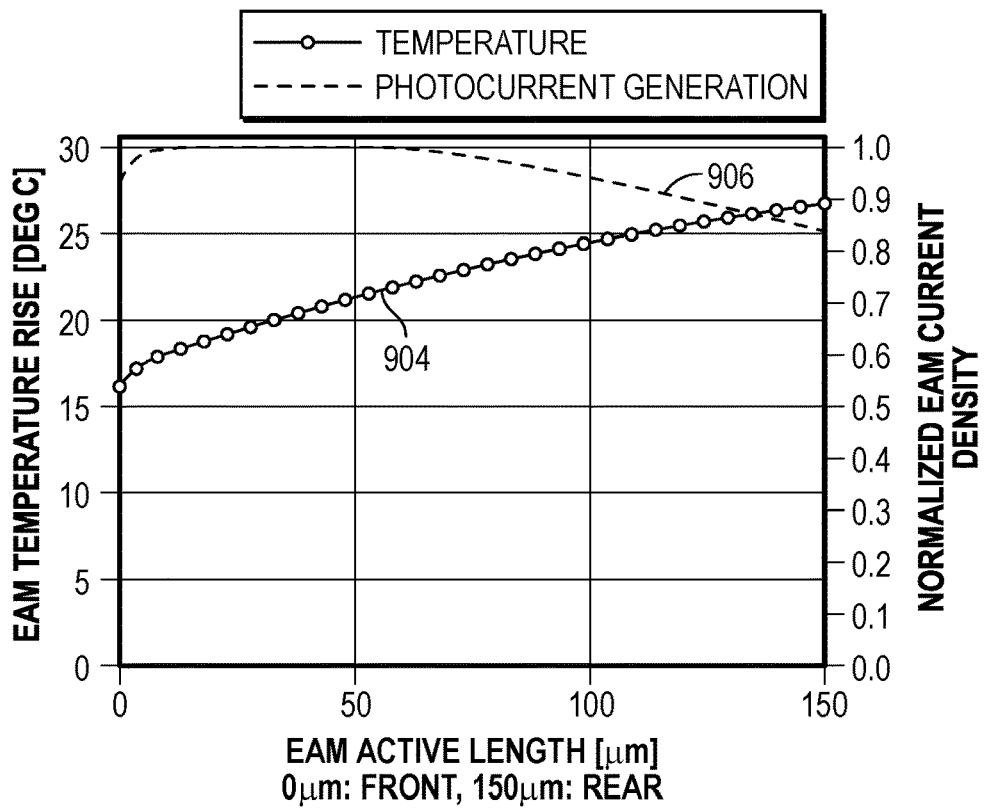
FIG. 9B is a graph of the temperature and normalized photocurrent density along an example EAM with a heater at the rear end, as shown in FIGS. 3A-3D, in accordance with the first embodiment.

The various embodiments described above with respect to FIGS. 3A-8 all tend to increase the photocurrent uniformity along the EAM, as compared with a conventional EAM as illustrated in FIGS. 1A-1D, and thereby improve the performance and operating life of the EAM. The photocurrent uniformity in accordance with various embodiments may be characterized, e.g., by a minimum photocurrent linear density along the active region that is no less than 60%, preferably no less than 80%, or even no less than 90% of the maximum photocurrent density. FIGS. 9A and 9B illustrate the improvement for an EAM 300 with integrated heater at the rear, operated with 20 mW optical input power and a drive swing voltage of 2V. The thermal impedance of the EAM 300 tested was about 2000° C./W.

FIG. 9A provides, for comparison, a graph of the temperature 900 and normalized photocurrent density 902 along an example conventional EAM 100 with a 150 μm long active region. As can be seen, the temperature 900 is highest at the front of the EAM, with about 25° C., and decreases towards the rear to 10° C. The photocurrent density 902 likewise decreases along the device, dropping at the rear end to about 40% of its value at the front of the active region.

FIG. 9B is a graph of the temperature 904 and normalized photocurrent density 906 along an example EAM 300 with a heater at the rear end. Here, the temperature profile is reversed, i.e., the temperature 904 increases in the direction of light propagation, from about 16° C. at the front of the active region to about 26° C. at the back. The photocurrent density 906 is, in this case, relatively uniform across the device, having a value at the rear that is about 80% of the photocurrent density at the front. Similar improvements may be expected for EAMs with multiple DC bias voltages, properly varied material properties, and/or waveguide taper overlap with the active region. Multiple different approaches to achieving photocurrent uniformity may also be used in conjunction to augment each other in their effect on the photocurrent density along the device.

Having described different embodiments of EAMs that achieve a more uniform photocurrent density, the following numbered examples are provided as illustrative embodiments:

1. An integrated electro-absorption modulator comprising: a layered diode structure formed above a device layer of a substrate, the diode structure comprising a bottom diode layer, an intrinsic diode layer, and a top diode layer; a waveguide formed in the device layer underneath the layered diode structure to couple light in and out of the intrinsic diode layer; electrical terminals contacting the top and bottom diode layers in an active region; a driver circuit connected between the electrical terminals and configured to apply a direct-current bias voltage and an alternating-current signal voltage across the layered diode structure; and a heater disposed at a rear end of the electro-ab sorption modulator to heat a rear portion of the active region.

2. The integrated electro-absorption modulator of example 1, wherein a heater power setting is optimized for an optical modulation amplitude associated with the integrated electro-absorption modulator.

3. The integrated electro-ab sorption modulator of example 1 or example 2, wherein the heater comprises winding heater filaments arranged laterally on both sides of the diode structure.

4. The integrated electro-ab sorption modulator of any of examples 1-3, wherein the waveguide is a silicon waveguide and the layered diode structure is made from III-V semiconductor material.

5. The integrated electro-absorption modulator of any of examples 1-4, wherein: the electrical terminals comprise multiple pairs of electrical terminals contacting the top and bottom diode layers in multiple contact regions within the active region, the multiple contact regions separated by isolating regions; and the driver circuit is connected between the multiple pairs of electrical terminals and configured to apply multiple respective direct-current bias voltages across the layered diode structure in the respective contact regions.

6. The integrated electro-ab sorption modulator of any of examples 1-5, wherein a material composition of the intrinsic layer varies between a front end of the active region and a rear end of the active region, resulting in an optical absorption coefficient that is greater at the rear end than at the front end.

7. The integrated electro-ab sorption modulator of any of examples 1-6, wherein the waveguide comprises a down-tapered section overlapping with the active region.

8. An integrated electro-absorption modulator comprising: a layered diode structure formed above a device layer of a substrate, the diode structure comprising a bottom diode layer, an intrinsic diode layer, and a top diode layer; a waveguide formed in the device layer underneath the layered diode structure to couple light in and out of the intrinsic diode layer; multiple pairs of electrical terminals contacting the top and bottom diode layers in multiple contact regions within an active region, the multiple contact regions separated by isolating regions; and a driver circuit connected between the multiple pairs of electrical terminals and configured to apply multiple respective direct-current bias voltages across the layered diode structure in the respective contact regions.

9. The integrated electro-ab sorption modulator of example 8, wherein the driver circuit is configured such that a direct-current bias voltage applied to a contact region at a back of the active region is greater than a direct-current bias voltage applied to a contact region at a front of the active region.

10. The integrated electro-absorption modulator of example 9, wherein the multiple direct-current bias voltages are optimized for an optical modulation amplitude associated with the integrated electro-absorption modulator.

11. The integrated electro-absorption modulator of any examples 8-10, wherein the driver circuit is further configured to apply an alternating-current signal voltage across the layered diode structure.

12. The integrated electro-ab sorption modulator of any of examples 8-10, wherein the driver circuit is further configured to apply multiple alternating-current signal voltages across the layered diode structure in the multiple contact regions.

13. An integrated electro-absorption modulator comprising: a layered diode structure formed above a device layer of a substrate, the diode structure comprising a bottom diode layer, an intrinsic diode layer, and a top diode layer; a waveguide formed in the device layer underneath the layered diode structure to couple light in and out of the intrinsic diode layer; electrical terminals contacting the top and bottom diode layers in an active region; and a driver circuit connected between the electrical terminals and configured to apply a direct-current bias voltage and an alternating-current signal voltage across the layered diode structure, wherein a material composition of the intrinsic layer varies between a front end of the active region and a rear end of the active region, resulting in an optical absorption coefficient that is greater at the rear end than at the front end.

14. The integrated electro-absorption modulator of example 13, wherein the intrinsic layer comprises multiple regions along a length of the active region, each of the multiple regions along the length of the active region having an associated uniform material composition, the multiple regions differing from each other in their respective material compositions.

15. The integrated electro-ab sorption modulator of example 13 or example 14, wherein the intrinsic layer comprises a quantum well structure, the quantum well structure varying between the front end and the rear end in at least one of elemental composition or thickness.

16. An integrated electro-absorption modulator comprising: a layered diode structure formed above a device layer of a substrate, the diode structure comprising a bottom diode layer, an intrinsic diode layer, and a top diode layer; a waveguide formed in the device layer underneath the layered diode structure to couple light in and out of the intrinsic diode layer; electrical terminals contacting the top and bottom diode layers in an active region; a driver circuit connected between the electrical terminals and configured to apply a direct-current bias voltage and an alternating-current signal voltage across the layered diode structure, wherein the waveguide comprises a down-tapered section overlapping with the active region.

17. The integrated electro-absorption modulator of example 16, wherein the down-tapered section of the waveguide overlaps with the active region by at least 10% of the length of the active region.

18. A method of calibrating an integrated electro-absorption modulator, the method comprising: measuring an insertion loss of the electro-absorption modulator and adjusting a direct-current bias voltage until a target insertion loss is reached; tuning a set of adjustable operating parameters of the electro-absorption modulator across a tuning range while maintaining the target insertion loss, and measuring an optical modulation amplitude for multiple values of the set of adjustable operating parameters to determine a set of operating parameter values associated with a maximum optical modulation amplitude; and setting the adjustable operating parameters to the determined set of operating parameter values.

19. The method of example 18, further comprising operating the electro-absorption modulator to modulate an optical signal.

20. The method of example 18 or example 19, wherein the tuning comprises incrementing a heater power of a heater placed at a rear end of an active region of the electro-absorption modulator and decrementing a DC bias voltage applied across the active region to maintain the target insertion loss.

21. The method of any of examples 18-20, wherein the tuning comprises incrementing a direct-current bias voltage applied to a region at a rear end of an active region while decrementing a direct-current bias voltage applied to a region at a front end of the active region to maintain the target insertion loss.

22. The method of any of examples 18-21, wherein a change to the set of adjustable operating parameters causes a change in an optical absorption coefficient of an active region of the electro-absorption modulator.

Although the inventive subject matter has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense.

What is claimed is:

1. An integrated electro-absorption modulator comprising:
   a layered vertical diode structure formed above a device layer of a substrate, the diode structure comprising a bottom diode layer, an intrinsic diode layer, and a top diode layer that are vertically stacked;
   a waveguide formed in the device layer underneath the layered vertical diode structure to couple light in and out of the intrinsic diode layer;
   electrical terminals contacting the top and bottom diode layers in an active region;
   a driver circuit connected between the electrical terminals and configured to apply a direct-current bias voltage and an alternating-current signal voltage across the layered vertical diode structure; and
   a heater disposed at a rear end of the electro-absorption modulator to heat a rear portion of the active region.

2. The integrated electro-absorption modulator of claim 1, wherein a heater power setting is optimized for an optical modulation amplitude associated with the integrated electro-absorption modulator.

3. The integrated electro-absorption modulator of claim 1, wherein the heater comprises winding heater filaments arranged laterally on both sides of the diode structure.

4. The integrated electro-absorption modulator of claim 1, wherein the waveguide is a silicon waveguide and the vertical layered diode structure is made from III-V semiconductor material.

5. The integrated electro-absorption modulator of claim 1, wherein:
the electrical terminals comprise multiple pairs of electrical terminals contacting the top and bottom diode layers in multiple contact regions within the active region, the multiple contact regions separated by isolating regions; and
the driver circuit is connected between the multiple pairs of electrical terminals and configured to apply multiple respective direct-current bias voltages across the vertical layered diode structure in the respective contact regions.

6. The integrated electro-absorption modulator of claim 1, wherein a material composition of the intrinsic layer varies between a front end of the active region and a rear end of the active region, resulting in an optical absorption coefficient that is greater at the rear end than at the front end.

7. The integrated electro-absorption modulator of claim 1, wherein the waveguide comprises a down-tapered section overlapping with the active region.

8. The integrated electro-absorption modulator of claim 1, wherein the electrical terminals comprise multiple pairs of electrical terminals contacting the top and bottom diode layers in multiple contact regions within the active region, the multiple contact regions separated by isolating regions.

9. The integrated electro-absorption modulator of claim 8, wherein the driver circuit is configured such that a direct-current bias voltage applied to a contact region at a back of the active region is greater than a direct-current bias voltage applied to a contact region at a front of the active region.

10. The integrated electro-absorption modulator of claim 9, wherein the direct-current bias voltage is optimized for an optical modulation amplitude associated with the integrated electro-absorption modulator.

11. The integrated electro-absorption modulator of claim 8, wherein the driver circuit is further configured to apply multiple alternating-current signal voltages across the layered diode structure in the multiple contact regions.

12. The integrated electro-absorption modulator of claim 1, wherein the intrinsic diode layer comprises a quantum well structure, the quantum well structure varying between a front end and a rear end of the intrinsic diode layer in at least one of elemental composition or thickness.

13. The integrated electro-absorption modulator of claim 1, wherein the waveguide comprises a down-tapered section overlapping with the active region.

14. The integrated electro-absorption modulator of claim 13, wherein the down-tapered section of the waveguide overlaps with the active region by at least 10% of a length of the active region.

* * * * *